(12) United States Patent
Brunier et al.

(10) Patent No.: US 7,601,606 B2
(45) Date of Patent: Oct. 13, 2009

(54) METHOD FOR REDUCING THE TRAP DENSITY IN A SEMICONDUCTOR WAFER

(75) Inventors: Francois Brunier, Grenoble (FR); Vivien Renauld, Pontcharra (FR); Jean Marc Waechter, Saint Vincent De Mercuze (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 329 days.

(21) Appl. No.: 11/541,199

(22) Filed: Sep. 28, 2006

(65) Prior Publication Data

US 2007/0020886 A1    Jan. 25, 2007

Related U.S. Application Data

(63) Continuation of application No. PCT/IB2005/000434, filed on Feb. 3, 2005.

(51) Int. Cl.
*H01L 21/76* (2006.01)
(52) U.S. Cl. ..................... 438/407; 438/423
(58) Field of Classification Search ............... 438/770, 438/778, 407, 423, 149, 151
See application file for complete search history.

(56) References Cited

U.S. PATENT DOCUMENTS

| | | | |
|---|---|---|---|
| 6,136,727 A * | 10/2000 | Ueno | 438/770 |
| 6,140,157 A * | 10/2000 | Warren et al. | 438/149 |
| 6,204,205 B1 | 3/2001 | Yu et al. | 438/787 |
| 6,309,968 B1 | 10/2001 | Chu et al. | 438/660 |
| 6,358,866 B1 * | 3/2002 | Stesmans et al. | 438/770 |
| 6,603,156 B2 * | 8/2003 | Rim | 257/190 |
| 6,649,538 B1 * | 11/2003 | Cheng et al. | 438/775 |
| 6,737,730 B1 | 5/2004 | Lane et al. | 257/640 |
| 2003/0013266 A1 * | 1/2003 | Fukuda et al. | 438/400 |
| 2003/0129817 A1 | 7/2003 | Visokay et al. | 438/591 |
| 2004/0126939 A1 * | 7/2004 | Baniecki et al. | 438/149 |
| 2005/0079664 A1 * | 4/2005 | Faris | 438/200 |
| 2006/0094259 A1 * | 5/2006 | Gilmer et al. | 438/785 |

OTHER PUBLICATIONS

Schjølberg-Henriksen, K. et al., "Oxide Charges Induced By Plasma Activation For Wafer Bonding", Sensors and Actuators, vol. A 102, pp. 99-105 (2002).
Colinge, J. P., "Silicon-On-Insulator Technology", Materials to VLSI, 2nd Edition, pp. 50-51 (1997).

* cited by examiner

*Primary Examiner*—Kiesha L Rose
*Assistant Examiner*—Mark W Tornow
(74) *Attorney, Agent, or Firm*—Winston & Strawn LLP

(57) ABSTRACT

The invention provides methods for reducing trap densities at interfaces in a multilayer semiconductor wafer, specifically trap densities between an active layer and an insulating layer under the active layer. The methods comprise exposing wafers to high temperatures in a generally neutral atmosphere that also comprises one or more species that can, or whose ions can, migrate into the wafer down to the interface where reduction of the trap density is desired.

19 Claims, 2 Drawing Sheets

METHOD FOR REDUCING THE TRAP DENSITY IN A SEMICONDUCTOR WAFER

CROSS-REFERENCE TO RELATED APPLICATIONS

This application is a continuation of International application PCT/IB2005/000434 filed Feb. 3, 2005, the entire content of which is expressly incorporated herein by reference thereto.

FIELD OF THE INVENTION

The invention is directed to reducing trap densities at interfaces within a multilayer semiconductor wafer. The applies many types of multilayer wafer made with semiconductor materials ("semiconductor wafers"), and is particularly advantageous for multilayer semiconductor wafers fabricated by a transfer method, and is more particularly advantageous for SOI-type wafers.

BACKGROUND OF THE INVENTION

DIT is a parameter that represents the density interface traps that limit the mobility of electrical carriers in the multilayer wafers, and carrier mobility has a key influence on the electrical performance of a multilayer wafer. As an example, traps represented by DIT values at a BOX/active layer interface of a SOI wafer affect the carrier mobility in the active layer. It has been shown that a lower DIT is associated with a higher carrier mobility.

Therefore, since it is desirable to increase the mobility of electrical carriers in the active layer of a multilayer semiconductor wafer, it is desirable to minimize DIT values at interfaces between active layers and adjacent layers in the wafer. In the case of SOI-type wafers comprising an active layer (e.g., Si) covering an insulating layer (e.g. Si oxide), it is desirable to reduce DIT values at the interface between the active surface layer and the buried oxide layer. Similarly, it is desirable to reduce the variability of DIT values among the multilayer wafers of a group of wafers, i.e., a group of wafers manufactured under the same conditions in a wafer manufacturing facility.

It is known to carry out low temperature thermal treatment of SOI-type wafers in order to reduce DIT and its variability in the wafer. Such treatments are carried out at temperatures up to 600° C. for durations between 30 and 120 min. in an atmosphere which is neutral, or which contains only a small amount of hydrogen (e.g. 2% $H_2$ in a $N_2$ or Ar atmosphere). Such treatment is referred to as a "Forming Gas Anneal" (FGA). See, e.g., Scholberg-Henriksen et al. Oxide Charges Induced by Plasma Activation for Wafer Bonding, Sensors and Actuators A 102 (2002), 99-105.

It has been observed that when a FGA treatment is carried out on a wafer comprising more than one layer, such treatment reduce DIT values only at the first interface located under the surface of the wafer ("interface" being here understood as the delimitation between two adjacent layers). In this respect, if a capping oxide layer which covers the surface of a Si wafer, the above-mentioned article discloses reducing DIT only at the interface between the capping oxide layer and the underlying Si layer.

Therefore, a FGA treatment could be carried out for reducing the DIT at the interface between the active layer and the underlying oxide layer in a SOI-type wafer, but this FGA treatment would not be effective if wafer is covered by a capping oxide layer. Reduction of DIT at the interface between the active layer and the underlying layer, which is desired, would not be achieved or expected. Capping oxide layers having a thickness from 100 to 3000 Angströms (e.g. 2000 Angströms) are usually present over the surface of these wafer during the intermediate and final stages of the manufacturing process, and are removed only at the end of the process.

Indeed, tests conducted by the inventors have shown that a FGA carried out on a SOI wafer covered with an oxide layer of 2000 Angströms has no effect on the DIT at the interface between the active layer and the underlying buried oxide layer. FGA conditions tested included exposure to 450° C. for 90 min. in an argon atmosphere containing 2% hydrogen. Therefore, FGA treatment does not appear as a solution to reducing DIT at the interface between the active layer and the underlying layer in the presence of a capping layer.

Alternatively, a FGA treatment could be performed after all manufacturing steps have been carried out on the SOI-type wafer, including the steps of removing the capping oxide on the wafer. But such treatment would mean adding another lengthy treatment at the end of the manufacturing process of the wafer, which is of course not desired.

It is also possible to conduct a FGA treatment during early stages of the manufacturing of a SOI-type wafer. For example, such early FGA could be carried out on a "top" substrate to be used in a SMART-CUT® layer transfer method, before the bonding of the top substrate with a base substrate. Although, this could reduce DIT at the interface between an active layer and an adjacent insulating (e.g. oxide) layer, reductions are not observed in practice. DIT is a temperature-sensitive parameter, and subsequent processing steps (bonding, transfer, stabilization, . . . ) include high temperature treatments which change the values of DIT obtained through the early FGA to less desirable values.

Thus, there is a need for a method which allows reducing the DIT and its variability in a multilayer wafer, without requiring a significant additional processing time of the wafer.

SUMMARY OF THE INVENTION

This invention provides methods that overcome these problems in the prior art, specifically methods for reducing the trap density at an interface between an active layer of a multilayer semiconductor wafer and an insulating layer buried within the multilayer wafer under the active layer.

The methods of this invention achieve such a reduction by exposing a multilayer wafer to a high temperature in a controlled generally neutral atmosphere into which is introduced a species which can, or whose ions can, migrate into the depth of the wafer down to the interface where reduction of the trap density is desired (also referred to as a "migratable species"). The high temperature is generally from about 800° C. to about 1200° C. and the introduced species preferably include hydrogen, or helium, or a mixture thereof. The methods of the invention can be performed and integrated into the steps of an existing multilayer wafer manufacturing processes, such as fabrication of silicon-on-insulator wafer by methods including layer transfers. In this case, it is preferable that no further high temperature exposures occur during the process after exposure to the neutral atmosphere with the selected species.

These methods for reducing the trap density at an interface between an active layer of a multilayer semiconductor wafer and an insulating layer buried within the multilayer wafer under the active layer are generally carried out in a controlled atmosphere during a high temperature thermal treatment of the multilayer wafer. Such a high temperature treatment can include the steps of, first, an oxidation phase at an oxidation temperature carried out in a generally neutral atmosphere controlled atmosphere having at least an oxidizing species and resulting in a capping of the surface of the wafer with a capping oxide layer; second, during thermal treatment after the oxidation phase, an introduction of at least one species whose ions can migrate into the depth of the wafer down to the interface where reduction of the trap density ("migratable species") is desired (equivalently, the atmosphere is controlled by introducing) into the controlled generally neutral atmosphere; and third after the thermal treatment, a deoxidation operation to remove the capping oxide layer created during the oxidation phase, In various embodiments, the migratable species can be introduced into the generally neutral atmosphere immediately after the oxidation phase; or before the deoxidation operation; or during a high temperature treatment applied to the multilayer wafer provided that no further high temperature treatments are performed on the multilayer wafer.

In various embodiments, the thermal treatment can further include, after the oxidation phase, a stabilization phase during which thermal annealing is performed in a generally neutral atmosphere to stabilize bonded interfaces of the multilayer wafer. The thermal annealing temperature can be substantially equal to the oxidation temperature, or substantially greater than the oxidation temperature; such as, between 950 and 1200° C., preferably about 1100° C. The migratable species can also be introduced during such annealing or during a temperature ramp-down following the stabilization phase. The ramp-down concludes at a boat-out temperature of about 450° C., or about 600° C., or about 750° C. Preferably, no other high temperature treatment carried out on the multilayer wafer before the deoxidation operation.

The introduced species may include one or more of hydrogen and/or helium. Preferably hydrogen is introduced to a concentration of at least 1% in a generally neutral atmosphere or preferably 4% hydrogen in a generally neutral atmosphere. The oxidizing species can be air or preferably oxygen. The oxidation temperature can be between 800 and 1000° C.; preferably 950° C., and particularly selected to generate a capping oxide layer having a thickness between 1000° C. and 3000° C. Angströms; generally about 2000 Angströms.

The multilayer wafer can be fabricated by a transfer method which includes implanting a donor substrate with at least one species in order to create in the donor substrate an embrittlement zone. A preferred transfer method can be SMART-CUT® method. The multilayer wafer can be SOI, with an active layer of silicon or strained silicon.

If desired, the method can be carried out on batches of multilayer wafers, and the boat out temperature can vary among the batches while obtaining a substantially constant value of the trap density for the wafers of all batches.

Further aspects and details and alternate combinations of the elements of this invention will be apparent from the following detailed description and are also within the scope of the inventor's invention.

BRIEF DESCRIPTION OF THE DRAWINGS

Other aspects, goals and advantages of the invention shall be apparent in the following description, made in reference to the drawing on which.

DETAIL DESCRIPTION OF THE PREFERRED EMBODIMENTS

Figure 1A:
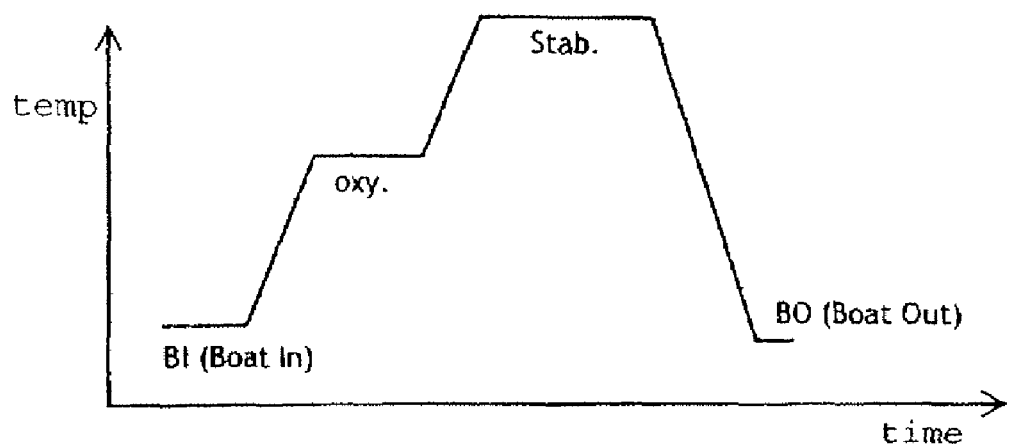
FIG. 1 A-C illustrate preferred embodiments of the methods of this invention.

Before turning to the method of the invention, certain definitions are presented with are used throughout this application. The term "transfer method" is used herein to refer to a method for manufacturing multilayer semiconductor wafers comprising a transfer step during which a top (or "donor") wafer is bonded on a base wafer (also called "handle", or "receiver" wafer) and at least part of the top wafer remains with the base wafer after the bonding. A transfer method can be carried out according to the SMART-CUT® method; the ELTRAN™ method; and other methods. For the SMART-CUT® method se, e.g., Jean-Pierre Colinge, *Silicon On Insulator Technologies-Materials to VLSI*, Kluwer Academic Publisher, $2^{nd}$ edition.

The term "DIT" (also known as "Dit") is used herein to refer to a parameter which characterizes the trap interface density, that is the density of electrical traps located at an interface between two layers of a multilayer structure (e.g. the interface between the buried oxide layer (BOX) and the surface active layer of a SOI structure). The term "DIT" and "trap interface density" are used herein as equivalent. DIT is generally expressed as a count of traps per $(eV.cm^2)$, i.e., in number/$eV.cm^2$, and typical values for the interface BOX/active layer in a SOI are $10^{12}$ $eV.cm^2$. DIT can be measured using, e.g., pseudo MOSFET measurement techniques.

The term "active layer" of a multilayer semiconductor wafer is used herein to refer to a layer in which components are to be created. The active layer is generally a surface layer of the wafer, and is generally electrically isolated from the rest of the wafer.

The term "SOI-type wafer" is used herein to refer to a multilayer wafer comprising: a support layer (e.g. bulk Si for a classical SOI); an active layer located on the surface region of the wafer (e.g. a thin film of Si—but possibly other types of films such as SiGe, Ge, or others); and a buried insulating layer between these two layers (e.g. a buried oxide or BOX layer).

The methods according to the invention reduce trap densities in multilayer wafers made of semiconductor materials, particularly at interfaces between an active layer and an insulating layer under the active layer. The methods are applicable to multilayer wafers comprising a substrate with a thin active surface layer of material for which electrical properties are to be optimized. The active layer can be of Si, or of other materials (such as SiGe, Ge, . . . ), or of strained materials. The term "buried" insulating layer refers to a layer which is buried under the active layer but which is not necessarily itself covering a support layer (other layers possibly intervening). The buried insulating layer can be e.g. a buried oxide (BOX) layer located immediately under the active layer. SOI-type wafers typically have such thin active layers over buried insulator layers, and the methods of this invention In preferred (but non limiting) embodiments, the method of this invention are applicable to SOI-type multilayer wafers.

The methods of this invention are performed during, or a part of, high temperature thermal treatments of multilayer wafers, where the tem "high temperature treatment" refers herein to a thermal treatment comprising exposing the wafer to temperatures of at least 950° C. The high temperature thermal treatment can optionally include an "oxidation phase" that serves to oxidize the surface of a multilayer semiconductor wafer (e.g., of the SOI-type) and. The oxidation phase creates a capping oxide layer on the surface of the multilayer wafer with a thickness which is preferably between about 1000 and about 3000 Angstroms (e.g. about 2000 Angstroms). The high temperature thermal treatment can optionally also include a "stabilization phase" that serves to stabilize a bonded interface between two layers of the multilayer wafer. Such a bonded interface can in particular result from the bonding of two substrates brought into contact by an earlier transfer method. Preferably, the oxidation phase, if present, precedes the stabilization phase, if present. Finally, the migratable selected species are introduced in the annealing chamber atmosphere only during a temperature ramp-down following a high temperature phase, e.g., a stabilization or an oxidation phase, the species are best introduced while the temperatures are still in the range of high temperatures.

The thermal treatment can optionally be followed by a deoxidation operation in order to remove the capping oxide layer producing a finished multilayer wafer. This deoxidation operation can comprise a chemical treatment, e.g. HF etching, and/or other types of treatments other than high temperature treatments.

To reduce DIT, it important to expose a multilayer wafer, especially a multilayer wafer with an active surface layer covered by a capping oxide layer (e.g., resulting from a previous oxidation phase), to a generally neutral atmosphere including selected species (such as hydrogen or helium) at "high temperatures" (e.g., temperatures of at least about 950° C. or higher). Such exposure serves to reduce DIT not only at a first interface encountered in the thickness of a wafer such as a SOI (e.g., the interface between the capping oxide layer and the active layer), but also at interface underlying the first interface (e.g., the interface between the active layer and an underlying oxide layer).

It is believed that this DIT reduction can be explained as follows. Under "high temperatures" the selected species, such as $H_2$ or He, in the controlled atmosphere have enough energy to penetrate the thickness of a multilayer wafer down to the desired interface, i.e. the interface between the active layer and an underlying insulating layer. However, if specific exposure of the wafer to selected species in such conditions does not occur, as in known prior art processes, the species do not penetrate the thickness of the wafer deeper than the first interface encountered, i.e., the interface between the capping oxide layer and the underlying active layer. In particular, the do not penetrate to the depth of the interface between the active layer and a buried insulator layer.

One of ordinary skill in the art would not expect DIT reduction upon exposing a multilayer wafer capped by an oxide layer to an atmosphere with a species such as hydrogen at a high temperature. According to known prior treatments, e.g., the classical FGA, one of ordinary skill would expect that such exposure would have no effect on the DIT of further interfaces under a first interface, e.g., an interface between a surface layer and a capping oxide layer of 2000 Angströms or so thickness.

Multilayer wafers (also referred to herein as "wafers") preferably are already fully fabricated to the extent of comprising all final layers. Therefore, subsequent to the methods of this invention, no further layers need be added by further processing, and no further layer transfer steps or layer growth steps are needed. Preferred multilayer can be fabricated by many methods known in the art. In particular, they can be obtained by layer transfer methods, which involve transfer and bonding of at least one layer from a donor (or "top") substrate onto a receiving (or "base") substrate. Such layer transfers can be facilitated by implanting at least one species in order to create in the donor substrate an embrittlement zone, e.g., as in SMART-CUT® type methods.

The invention can be preferably applied both to unstrained SOI-type wafers and to "strained Silicon On Insulator" (sSOI) type wafers. sSOI wafers comprise a strained surface Si layer of typical thickness between about 100 and about 600 Angströms that is positioned directly on top of a buried insulating layer, a supporting layer or substrate being under the buried insulating layer. Because of the thinness of the strained layer, a high temperature oxidation or stabilization phase is generally not advantageous. Instead, such wafers can be fabricated by first depositing a capping oxide layer having a thickness between about 100 and about 3000Angströms on a sSOI multilayer wafer by, e.g., TEOS deposition. Also, it is possible to form an extremely thin thermal oxide layer (native oxide layer or only slightly thicker) on the strained layer and then deposit a thicker capping oxide layer. Once the strained layer has been covered by a capping oxide layer, it is protected from high temperatures and can undergo the method according to the invention.

For carrying out a high temperature thermal treatment during which the methods of the invention are performed, a wafer is first placed in an annealing (or heating) chamber having a atmosphere the composition of which can be controlled to meet the needs of the different phases of the thermal treatment. The method of the invention then control the composition of this atmosphere so that at sometime during the thermal treatment, but after the oxidation phase, it comprises a generally neutral atmosphere with a selected proportion of one of more selected species. The species are selected so that they or their ions can migrate into the depth of the wafer down to the interface where reduction of the trap density is desired. In the case of SOI-type waver, this is the interface between the active layer and the buried insulating layer. Preferred species are hydrogen or helium or a mixture thereof.

A preferred thermal profile for practicing the invention comprises a starting phase, or an entry phase, carried out at a boat-in, equivalently, an initial, temperature. The initial, or boat-in, temperature is preferably between about 450 and about 750° C., More preferably the initial temperature is about 600° C. Next, the temperature in the chamber is ramped-up from the boat in temperature to an oxidation temperature, and an oxidation phase carried out at the oxidation temperature so that the wafer is capped with an oxide layer. For those multilayer wafers for which a capping oxide layer is provided without a high temperature oxidation phase, the methods of the invention can be performed during a high temperature treatment subsequent to forming the capping oxide layer.

Following the oxidation phase, an optional stabilization phase is carried out at a stabilization temperature. In alternative embodiments of the invention, the stabilization temperature is substantially greater than the oxidation temperature; or the stabilization temperature is substantially equal to the oxidation temperature; or the stabilization phase is omitted. For the first alternative, the stabilization phase begins with a further temperature ramp-up from the oxidation temperature up to the stabilization temperature. In all embodiments, a final phase of the thermal treatment comprises a temperature ramp-down to bring the temperature down to a final, or a boat-out, temperature, and an optional ending step carried out at the boat-out temperature. The final or boat-out temperature is often about equal to the initial, or boat-in, temperature.

The methods of the invention control the composition of the atmosphere in the annealing chamber during the high temperature treatment (alternately, the atmosphere in the annealing chamber during the high temperature treatment is a "controlled atmosphere", and the methods of the invention "control" the "controlled atmosphere"). During a starting phase, the controlled composition is preferably substantially neutral (or unreactive), comprising neutral gases such as $N_2$ or Ar.

During the oxidation phase, the atmosphere is further controlled so that it also comprises an oxidizing species such as oxygen. The temperature and the duration of this phase are adjusted to achieve the thickness desired for the capping oxide, e.g., preferably between about 1000 to about 3000 Angströms, and more preferably about 2000 Angströms. The preferred oxidation temperature is between about 800 and about 1000° C., and more preferably about 950° C.

Then immediately after the oxidation phase, or alternatively before or during the stabilization phase, the composition of the atmosphere is again primarily neutral (e.g., oxidizing species previously present being purged or removed) but also comprises a controlled proportion of one or more selected species which can migrate, or whose ions can migrate, down to the interface at which reduction of the trap density is desired. This high temperature treatment in a generally neutral atmosphere with a proportion of a selected species is carried out before a deoxidation operation (e.g., immediately after the oxidation phase or before or during the stabilization phase). Preferably, the high temperature treatment of the invention is the last high temperature thermal treatment to be undergone by the wafer. It has been observed that reduced DIT can be increased again by further high temperature treatments.

Preferably, the substantially neutral component of the atmosphere comprises one or more unreactive gases, e.g., argon and/or nitrogen and/or mixtures thereof . The one or more selected species preferably comprise hydrogen and/or helium and/or mixtures thereof with H2 being more preferred. The concentration of the one or more preferred species in the annealing chamber atmosphere is about 1% to about 4%. Inventors have conducted tests in which hydrogen was injected into an otherwise neutral $N_2$ atmosphere to controlled proportion of about 4% (the composition of the resulting atmosphere being about 4% H2 and abut 96% $N_2$). Such tests produced significant reductions of the DIT at the interface between an active Si layer and the buried oxide layer of a SOI and under the interface of the capping oxide layer and the active layer.

Three preferred and particular embodiments, option 1, option 2, and option 3, for treating multilayer wafers are now be described with reference to FIGS. 1 A-C.

FIG. 1A illustrates a first particular embodiment, option 1, of the invention in which the oxidation phase is followed by a stabilization phase carried out at a temperature substantially greater than the oxidation temperature. For example, the stabilization temperature can be between about 950 and about 1200° C., a preferred value being about 1100° C. The stabilization phase serves to stabilize a bonded interface.

The atmosphere in the annealing chamber that during the stabilization phase comprises selected species, such as $H_2$ or He, in a proportion between about 1% and 4%, the remainder being generally neutral gases. These species can conveniently be injected into the annealing chamber atmosphere, preferably only once when the stabilization temperature has been reached and/or during a subsequent temperature ramp-down. In the prior art, such stabilization phases have been carried out in a purely neutral atmosphere.

If the selected species, such as $H_2$ or He, are injected only during the ramp-down (i.e. not during the stabilization), the injection is preferably performed at the beginning of the ramp-down, when the temperature is still at a "high temperatures", i.e., above about 950° C., in order that at least the beginning of the ramp-down occurs at a high temperature in an atmosphere containing a controlled amount of selected species such as $H_2$ or He.

For reasons of safety, in all embodiments of the invention, it is preferred that a controlled atmosphere comprising selected species such as $H_2$ or He be purged before opening the annealing chamber and that all oxidizing components be removed before injecting $H_2$.

Figure 1B:
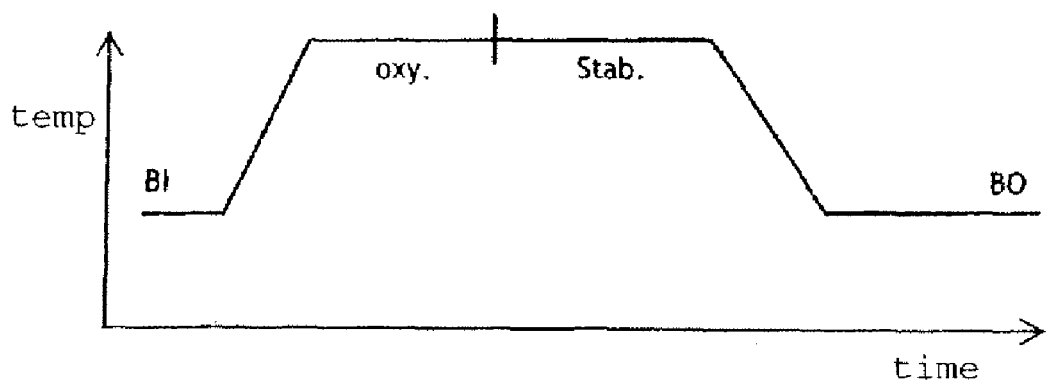

FIG. 1B illustrates a second particular embodiment, option 2, of the invention, in which the stabilization phase is carried out immediately after the oxidation phase at a temperature which is substantially equal to the oxidation temperature. For example, both the oxidation and the stabilization phases can be carried out at a temperature of at least about 950° C.

Oxidants are purged from the atmosphere between the oxidation phase and the stabilization phase, and the controlled injection of species such as $H_2$ or He is performed during the stabilization phase, or before the beginning of the temperature ramp-down which follows. Such an atmosphere can then be present during the ramp-down.

Figure 1C:
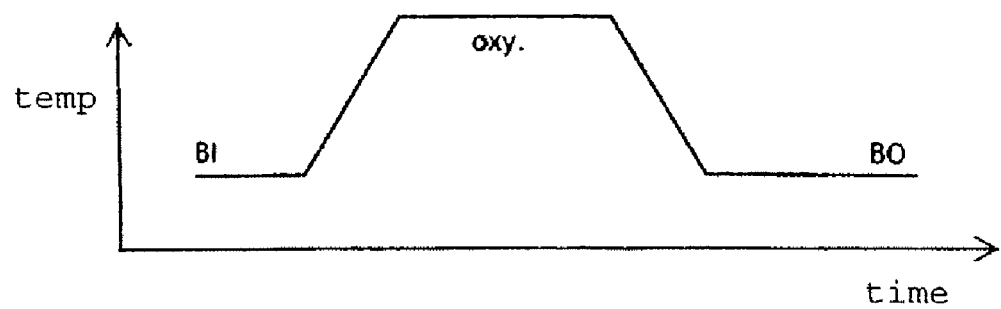

FIG. 1C illustrates a third particular embodiment, option 3, of the invention. In this option, there is no stabilization phase after the oxidation phase. This option is preferred if it is desired to reduce the thickness of the wafer (the oxidation and the subsequent deoxidation being a sacrificial oxidation) and if no stabilization of a bonded interface is sought.

The oxidation phase is carried out at an oxidation temperature of at least 950° C., and the controlled injection of species such as $H_2$ or He is performed after oxidants are purged from the atmosphere of the annealing chamber and during temperature the ramp-down which follows the oxidation phase. Such an atmosphere is preferably established while the temperature is still in a high temperature range. Accordingly, the injection is preferably performed as early as possible during the ramp-down.

EXAMPLES

Figure 2:
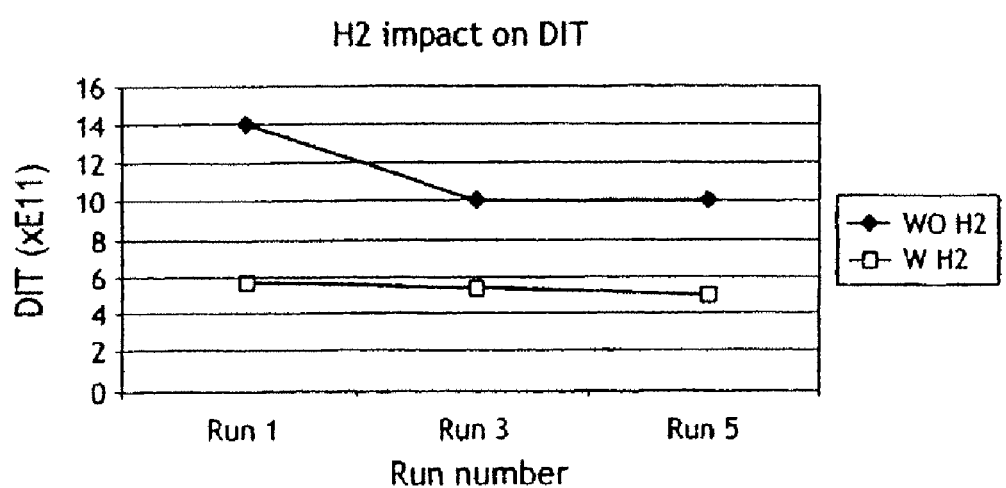
FIG. 2 is a graph illustrating various measured DIT values.

FIG. 2 illustrates results of experiments conducted by the inventors on SOI wafers fabricated by a method based on the SMART-CUT® technology. This figure shows the value of the DIT measured on groups of otherwise identical wafers, labelled respectively to "run1", "run2" and "run3", that have been processed under the same conditions, except for the presence and absence of H2 and except for different boat-out, or final, temperatures:

run1: with and without H2 at a boat-out temperature of 450° C., run2: with and without H2 at a boat-out temperature of 600° C., run3: with and without H2 at a boat-out temperature of 750° C.

All runs included a starting phase followed by an oxidation phase at 950° C. and then by a stabilizing phase at a temperature of about 1100° C. The DIT measurements were carried out in the same manner for all runs.

FIG. 2 illustrates two curves, each curve defined by three points (a point for each group or "run"). The upper curve in FIG. 2 shows the DIT measured on wafers having undergone a stabilizing treatment with a purely neutral atmosphere (no H2), such as Ar or N2, i.e., according to the prior art.

The lower curve in FIG. 2 shows the DIT measured on wafers having undergone a treatment which differed from the stabilizing treatment of the upper curve (the prior art) only by the presence of 4% $H_2$ in the neutral atmosphere immediately after the oxidizing phase and during the stabilization phase.

It can be appreciated that the presence of 4% $H_2$ led to a significant decrease of DIT values (about 50%), and also a significant decrease of the variability of DIT values. The methods of this invention achieve significant decreases of the DIT and of its variability between an active layer and a buried oxide layer of a multilayer wafer (e.g. at the BOX/active layer interface of a SOI).

These decreases did not require additional processing time, since the methods are performed during a stabilizing phase that is required in any case for stabilizing the bonded interface between layers of the wafer. The invention therefore provides the advantages of FGA treatments, without requiring additional time.

FIG. 2 illustrates the advantageous robustness of the methods of the invention. The DIT values for the three runs according to the invention with H2 were substantially equal, although the three boat-out temperatures were different. In contrast, the wafers for the three runs without H2 generally had increasing DIT values with decreasing boat-out temperatures. Therefore, the invention also selection of boat-out temperatures without needing to consider possible increases in the DIT. Batches of wafers can be processed according to the invention with modifications of the boat-out temperature yet still obtain stable values of the DIT at the interface (active layer / buried insulating layer). In particular, the invention also allows low boat-out temperatures without degrading the DIT.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims.

In the following (and in the application as a whole), headings and legends are used for clarity and convenience only. A number of references are cited herein, the entire disclosures of which are incorporated herein, in their entirety, by reference for all purposes. Further, none of the cited references, regardless of how characterized above, is admitted as prior to the invention of the subject matter claimed herein.

What is claimed is:

1. A method for manufacturing a mutilayer semiconductor wafer having reduced interfacial trap densities, the method comprising:
   providing a multilayer wafer comprising a surface that includes a capping oxide layer, an active semiconductor layer underlying the capping layer, a first internal interface, and at least one second internal interface, each interface being between a semiconductor layer and an adjoining insulator layer, with the first interface located between the capping oxide layer and the underlying active semiconductor layer, the second interface of the multilayer wafer located between an active semiconductor layer and an underlying buried oxide layer, and the second interface being further removed from the surface of the multilayer wafer than is the first internal interface;
   introducing a controlled proportion of a species into a generally neutral atmosphere, wherein the species is an element that is different than the atmosphere; and
   exposing the wafer to the atmosphere and species at a selected temperature between about 800° C. and about 1200° C., wherein the introduced species migrates at least to the second interface, reducing the interfacial trap density at that interface.

2. The method of claim 1 wherein any processing steps subsequent to introducing the species comprise exposure of the wafer only to temperatures that are lower than the selected temperature.

3. The method of claim 1 wherein the species comprises hydrogen, helium, or a mixture thereof.

4. The method of claim 1 wherein the controlled proportion of the species comprises between about 1% and 4% of the generally neutral atmosphere.

5. The method of claim 1 further comprising performing a stabilization phase that comprises thermally annealing the multilayer wafer in a generally neutral atmosphere at an annealing temperature sufficient to stabilize a bonded internal interface of the multilayer wafer.

6. The method of claim 5 wherein the introducing of a species is performed during the stabilization phase.

7. The method of claim 1 further comprising ramping-down the temperature to which the multilayer wafer is being exposed.

8. The method of claim 7 wherein the introducing of a species is performed during the ramping-down of the temperature, at a temperature between about 800° C. and about 1200° C.

9. The method of claim 7 wherein the ramping-down ends at a final temperature of between about 450° C. and about 750° C.

10. The method of claim 1 wherein the capping oxide layer has a thickness between approximately 1000 Angströms and approximately 3000 Angströms.

11. The method of claim 1 wherein the capping oxide layer is provided by exposing the wafer at an oxidation temperature to a controlled atmosphere comprising at least one oxidizing species to oxidize the surface of the wafer.

12. The method of claim 11 wherein the oxidation temperature is between about 800° C. and about 1000° C. and the oxidizing species comprises oxygen.

13. The method of claim 11 wherein the species is introduced after the oxidizing and at the oxidation temperature.

14. The method of claim 11 further comprising deoxidizing the multilayer wafer subsequent to the exposing.

15. The method of claim 1 wherein the active semiconductor layer comprises silicon.

16. The method of claim 1 wherein the active semiconductor layer comprises strained silicon.

17. The method of claim 1 wherein the provided multilayer wafer comprises a silicon-on-insulator structure with a capping oxide layer.

18. The method of claim 1 wherein the generally neutral atmosphere comprises argon, nitrogen, or a mixture thereof.

19. A method for manufacturing a mutilayer semiconductor wafer having reduced interfacial trap densities, the method comprising:
   providing a multilayer wafer comprising a surface that includes a capping oxide layer, an active semiconductor layer underlying the capping layer, a first internal interface, and at least one second internal interface, each interface being between a semiconductor layer and an adjoining insulator layer, with the first interface located between the capping oxide layer and the underlying active semiconductor layer, the second interface of the multilayer wafer located between an active semiconductor layer and an underlying buried oxide layer, and the second interface being further removed from the surface of the multilayer wafer than is the first internal interface;
   introducing a controlled proportion of a species of hydrogen, helium, or a mixture thereof into a generally neutral atmosphere comprising argon, nitrogen, or a mixture thereof, wherein the controlled proportion of the species comprises between about 1% and 4% of the generally neutral atmosphere; and
   exposing the wafer to the atmosphere and species at a selected temperature between about 800° C. and about 1200° C., wherein the introduced species migrates at least to the second interface, reducing the interfacial trap density at that interface.

* * * * *

UNITED STATES PATENT AND TRADEMARK OFFICE
CERTIFICATE OF CORRECTION

PATENT NO. : 7,601,606 B2 Page 1 of 1
APPLICATION NO. : 11/541199
DATED : October 13, 2009
INVENTOR(S) : Brunier et al.

It is certified that error appears in the above-identified patent and that said Letters Patent is hereby corrected as shown below:

<u>Column 3</u>:
Lines 39-40, before the word "Angströms" change "1000° C. and 3000° C." to -- 1000 and 3000 --.

<u>Column 9</u>:
Line 31 (claim 1, line 1), change "mutilayer" to -- multilayer --.

<u>Column 10</u>:
Line 38 (claim 19, line 1), change "mutilayer" to -- multilayer --.

Signed and Sealed this

Twenty-fourth Day of November, 2009

David J. Kappos
*Director of the United States Patent and Trademark Office*